(12) United States Patent
Guo

(10) Patent No.: US 10,608,170 B2
(45) Date of Patent: Mar. 31, 2020

(54) ELECTRIC FIELD ASSISTED PERPENDICULAR STT-MRAM

(71) Applicant: Yimin Guo, San Jose, CA (US)

(72) Inventor: Yimin Guo, San Jose, CA (US)

(73) Assignee: Shanghai CiYu Information Technologies Co., LTD, Jiading, Shanghai (CN)

( * ) Notice: Subject to any disclaimer, the term of this patent is extended or adjusted under 35 U.S.C. 154(b) by 17 days.

(21) Appl. No.: 14/159,116

(22) Filed: Jan. 20, 2014

(65) Prior Publication Data

US 2014/0203341 A1  Jul. 24, 2014

Related U.S. Application Data

(60) Provisional application No. 61/754,923, filed on Jan. 21, 2013.

(51) Int. Cl.
| | |
|---|---|
| *H01L 43/12* | (2006.01) |
| *H01L 27/1159* | (2017.01) |
| *H01L 43/08* | (2006.01) |
| *H01L 43/02* | (2006.01) |
| *H01L 27/22* | (2006.01) |

(52) U.S. Cl.
CPC .......... *H01L 43/12* (2013.01); *H01L 27/1159* (2013.01); *H01L 43/02* (2013.01); *H01L 43/08* (2013.01); *H01L 27/228* (2013.01)

(58) Field of Classification Search
CPC ...... H01L 27/22; H01L 27/222; H01L 27/226
See application file for complete search history.

(56) References Cited

U.S. PATENT DOCUMENTS

| | | | |
|---|---|---|---|
| 8,004,881 B2* | 8/2011 | Zhu .......................... | G11C 11/16 365/148 |
| 2011/0183157 A1* | 7/2011 | Lindberg ................ | B28B 1/002 428/703 |

* cited by examiner

Primary Examiner — Trang Q Tran

(57) ABSTRACT

A perpendicular STT-MRAM comprises apparatus, a method of operating and a method of manufacturing a spin-torque magnetoresistive memory and a plurality of magnetoresistive memory element having a recording layer which has an interface interaction with an underneath dielectric functional layer. The energy switch barrier of the recording layer is reduced under an electric field applying along a perpendicular direction of the functional with a proper voltage on a digital line from a control circuitry; accordingly, the perpendicular magnetization of the recording layer is readily reversible in a low spin-transfer switching current.

19 Claims, 4 Drawing Sheets

ELECTRIC FIELD ASSISTED PERPENDICULAR STT-MRAM

RELATED APPLICATIONS

This application claims the priority benefit of U.S. Provisional Application No. 61/754,923, filed Jan. 21, 2013, which is incorporated herein by reference.

BACKGROUND OF THE INVENTION

1. Field of the Invention

This invention relates generally to a perpendicular spin-transfer-torque magnetic-random-access memory (MRAM) element and a method of manufacturing the same magnetoresistive element, more particularly to structures and methods of reading and programming a spin-torque magnetoresistive random access memory (MRAM) element having an electric field assisted recording.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can also cope with high-speed reading and writing. A ferromagnetic tunnel junction has a three-layer stack structure formed by stacking a recording layer having a changeable magnetization direction, an insulating tunnel barrier layer, and a fixed layer that is located on the opposite side from the recording layer and maintains a predetermined magnetization direction. Corresponding to the parallel and anti-parallel magnetic states between the recording layer magnetization and the reference layer magnetization, the magnetic memory element has low and high electrical resistance states, respectively. Accordingly, a detection of the resistance allows a magnetoresistive element to provide information stored in the magnetic memory device.

There has been a known technique for achieving a high MR ratio by forming a crystallization acceleration film that accelerates crystallization and is in contact with an interfacial magnetic film having an amorphous structure. As the crystallization acceleration film is formed, crystallization is accelerated from the tunnel barrier layer side, and the interfaces with the tunnel barrier layer and the interfacial magnetic film are matched to each other. By using this technique, a high MR ratio can be achieved.

Typically, MRAM devices are classified by different write methods. A traditional MRAM is a magnetic field-switched MRAM utilizing electric line currents to generate magnetic fields and switch the magnetization direction of the recording layer in a magnetoresistive element at their cross-point location during the programming write. A spin-transfer torque (or STT)-MRAM has a different write method utilizing electrons' spin momentum transfer. Specifically, the angular momentum of the spin-polarized electrons is transmitted to the electrons in the magnetic material serving as the magnetic recording layer. According to this method, the magnetization direction of a recording layer is reversed by applying a spin-polarized current to the magnetoresistive element. As the volume of the magnetic layer forming the recording layer is smaller, the injected spin-polarized current to write or switch can be also smaller. In a so-called perpendicular STT-MRAM, both two magnetization films in an MTJ stack have easy axis of magnetization in a direction perpendicular to the film plane due to their strong magnetic crystalline anisotropy and interface interaction induced anisotropy, shape anisotropies are not used, and accordingly, the device shape can be made smaller than that of an in-plane magnetization type. Also, variance in the easy axis of magnetization can be made smaller. Accordingly, both miniaturization and lower currents can be expected to be achieved while a thermal disturbance resistance is maintained. In another word, perpendicular STT-MRAM having high speed, large capacities and low-power-consumption operations can potentially replace the conventional semiconductor memory used in electronic chips, especially mobile chips for power saving and non-volatility.

Besides a write current, the stability of the magnetic orientation in a MRAM cell as another critical parameter has to be kept high enough for a good data retention, and is typically characterized by the so-called thermal factor which is proportional to the perpendicular anisotropy as well as the volume of the recording layer cell size.

To record information or change resistance state, typically a recording current is provided by its CMOS transistor to flow in the stacked direction of the magnetoresistive element, which is hereinafter referred to as a "vertical spin-transfer method." Generally, constant-voltage recording is performed when recording is performed in a memory device accompanied by a resistance change. In a STT-MRAM, the majority of the applied voltage is acting on a thin oxide layer (tunnel barrier layer) which is about 10 angstroms thick, and, if an excessive voltage is applied, the tunnel barrier breaks down. More, even when the tunnel barrier does not immediately break down, if recording operations are repeated, the element may still become nonfunctional such that the resistance value changes (decreases) and information readout errors increase, making the element un-recordable. Furthermore, recording is not performed unless a sufficient voltage or sufficient spin current is applied. Accordingly, problems with insufficient recording arise before possible tunnel barrier breaks down.

In the mean time, since the switching current requirements reduce with decreasing MTJ element dimensions, STT-MRAM has the potential to scale nicely at even the most advanced technology nodes. However, patterning of small MTJ element leads to increasing variability in MTJ resistance and sustaining relatively high switching current or recording voltage variation in a STT-MRAM.

Reading STT MRAM involves applying a voltage to the MTJ stack to discover whether the MTJ element states at high resistance or low. However, a relatively high voltage needs to be applied to the MTJ to correctly determine whether its resistance is high or low, and the current passed at this voltage leaves little difference between the read-voltage and the write-voltage. Any fluctuation in the electrical characteristics of individual MTJs at advanced technology nodes could cause what was intended as a read-current, to have the effect of a write-current, thus reversing the direction of magnetization of the recording layer in MTJ.

Thus, it is desirable to provide perpendicular STT-MRAM structures and methods that realize highly-accurate reading, highly-reliable recording and low power consumption while suppressing destruction and reduction of life of MTJ memory device due to recording in a nonvolatile memory that performs recording resistance changes, and maintaining a high thermal factor for a good data retention.

BRIEF SUMMARY OF THE PRESENT INVENTION

The present invention comprises a perpendicular magnetoresistive element having an electric field assisted magnetization switching of a recording layer for a low power perpendicular spin-transfer-torque MRAM with a large operating margin. The perpendicular magnetoresistive element in the invention has three terminals: an upper electrode connected to a bit line, a middle electrode connected to a select transistor and a digital line as a bottom electrode wherein an MTJ stack is sandwiched between an upper electrode and a middle electrode, a dielectric functional layer is sandwiched between a middle electrode and a digital line of each MRAM memory cell, which also comprises a write circuit which supplies a voltage drop or electric field on a functional layer and bi-directionally supplies a spin polarized current to the MTJ stack.

An exemplary embodiment includes method of operating a perpendicular spin-transfer-torque magnetoresistive memory including a circuitry coupled to the bit line positioned adjacent to selected ones of the plurality of magnetoresistive memory elements to supply a reading current or bi-directional spin-transfer recording current, and coupled to the digital line configured to generate an electric field pointing a way from the top surface of the functional layer and accordingly to decrease the perpendicular anisotropy strength of the recording layer. Thus magnetization of a recording layer can be readily switched or reversed to the direction in accordance with a direction of a current across the MTJ stack by applying a low spin transfer current.

Another exemplary embodiment includes a recording layer consisting of one or more nonmagnetic insertion layers and magnetic sub-layers and includes method of operating a perpendicular spin-transfer-torque magnetoresistive memory including a circuitry coupled to the bit line positioned adjacent to selected ones of the plurality of magnetoresistive memory elements to supply a reading current or bi-directional spin-transfer recording current, and coupled to the digital line configured to generate an electric field pointing away from the top surface of the functional layer, decreasing the perpendicular anisotropy strength and rotating the magnetization of the bottom sub-layer in a recording layer in a film plane, accordingly generating an in-plane demag bias field acting on the top sub-layer magnetization of the recording layer. Thus a low write current is readily achieved while maintaining a high thermal stability and improving margins among reading, recording voltage and breakdown voltage.

The present invention further comprises a method of manufacturing a perpendicular magnetoresistive memory element having an electric field assisted switching.

Various embodiments will be described hereinafter with reference to the companying drawings. The drawings are schematic or conceptual, and the relationships between the thickness and width of portions, the proportional coefficients of sizes among portions, etc., are not necessarily the same as the actual values thereof.

DETAILED DESCRIPTION OF THE INVENTION

Figure 1:
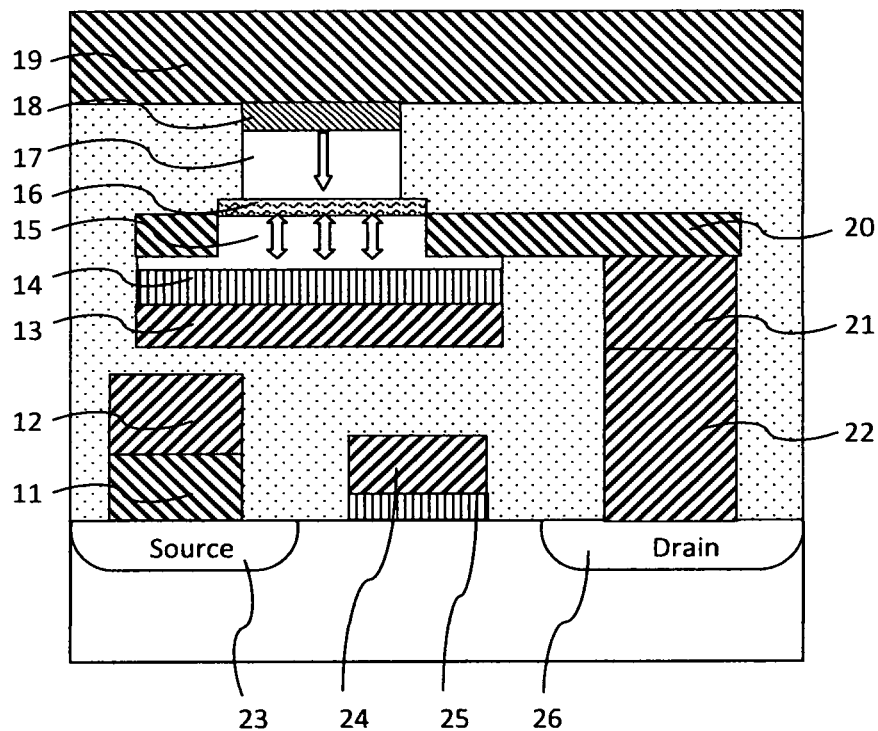
FIG. 1 is across-section of one memory cell in a perpendicular STT-MRAM array having an electric field assisted switching.

In general, according to each embodiment, there is provided a perpendicular magnetoresistive memory cell comprising:

a digital line provided on a surface of a substrate serving as a bottom electrode;

a dielectric functional layer provided on the top surface of the digital line layer;

a recording layer provided on the top surface of the dielectric functional layer having magnetic anisotropy in a direction perpendicular to a film surface and having a variable magnetization direction;

a tunnel barrier layer provided on the top surface of the recording layer;

a reference layer provided on the top surface of the tunnel barrier layer having magnetic anisotropy in a direction perpendicular to a film surface and having an invariable magnetization direction;

a cap layer provided on the top surface of the reference layer as an upper electric electrode;

a middle electrode provided on sides of the recording layer and electrically connected to the recording layer;

a bit line provided on the top surface of the cap layer;

a CMOS transistor coupled the plurality of magnetoresistive memory elements through the middle electrode.

There is further provided circuitry connected to the bit line, the digital line and the select transistor of each magnetoresistive memory cell.

A dielectric functional layer is made of a metal oxide (or nitride, chloride) layer having a naturally stable rocksalt crystal structure having the (100) plane parallel to the substrate plane and with lattice parameter along its {110} direction being larger than the bcc (body-centered cubic)-phase Co lattice parameter along {100} direction. As an amorphous ferromagnetic material, like CoFeB, in the recording layer is thermally annealed, a crystallization process occurs to form bcc CoFe grains having epitaxial growth with (100) plane parallel to surface of the rocksalt crystal functional layer.

In a rocksalt crystal structure of a functional layer, such as MgO, two fcc sublattices for metal atoms and O atoms, each displaced with respect to the other by half lattice parameter along the [100] direction. However, at a surface, O atoms protrude while metal atoms retreat slightly from the surface, forming a strong interface interaction with the bcc CoFe grains. Accordingly, a perpendicular anisotropy and a perpendicular magnetization are induced in the recording layer, as a result of the strong interface interaction between the recording layer and the functional layer.

Further, as an electric field is applied on the functional layer and perpendicular to the surface, the negative charged O atoms and positive charged metal atoms at surface are pulled toward opposite directions and modify the interface interaction between the bcc CoFe grains in the soft adjacent layer and the rocksalt crystal grains in the functional layer. When an electric field points down towards the top surface of a functional layer, O atoms protrude more from the surface and form a stronger interface interaction with the bcc CoFe grains, causing an enhanced perpendicular anisotropy, and vice versa. This mechanism is utilized hereafter to manipulate the perpendicular anisotropy strength and magnetization direction of the recording layer through applying an electric field on the dielectric functional layer.

An exemplary embodiment includes method of operating a perpendicular spin-transfer-torque magnetoresistive memory including a circuitry coupled to the bit line positioned adjacent to selected ones of the plurality of magnetoresistive memory elements to supply a reading current or bi-directional spin-transfer recording current, and coupled to the digital line configured to generate an electric field pointing away from the top surface of the functional layer and accordingly to decrease the perpendicular anisotropy strength of the recording layer. Thus magnetization of a recording layer can be readily switched or reversed to the direction in accordance with a direction of a current across the MTJ stack by applying a low spin transfer current.

Another exemplary embodiment includes a recording layer consisting of one or more nonmagnetic insertion layers and magnetic sub-layers and includes method of operating a perpendicular spin-transfer-torque magnetoresistive memory including a circuitry coupled to the bit line positioned adjacent to selected ones of the plurality of magnetoresistive memory elements to supply a reading current or bi-directional spin-transfer recording current, and coupled to the digital line configured to generate an electric field pointing away from the top surface of the functional layer, decreasing the perpendicular anisotropy strength and rotating the magnetization of the bottom sub-layer of a recording layer in a film plane, accordingly generating an in-plane demag bias field acting on the top sub-layer magnetization of the recording layer. Thus a low write current is readily achieved while maintaining a high thermal stability and improving margins among reading, recording voltage and breakdown voltage.

The following detailed descriptions are merely illustrative in nature and are not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

FIG. 1 is across-sectional view of a magnetoresistive memory cell 10 in a STT-MRAM array having an electric field assisted switching. The magnetoresistive memory cell 10 is configured by a bit line 19, a cap layer 18, a reference layer 17, a tunnel barrier 16, a recording layer 15, a dielectric functional layer 14, a digital line 13, and a select transistor comprising an interconnect layer 12, a source contact 11, a middle electrode 20, a via 21, drain contact 22, source region 23, a gate insulating film 24, a gate electrode 25 and a drain region 26.

Figure 2:
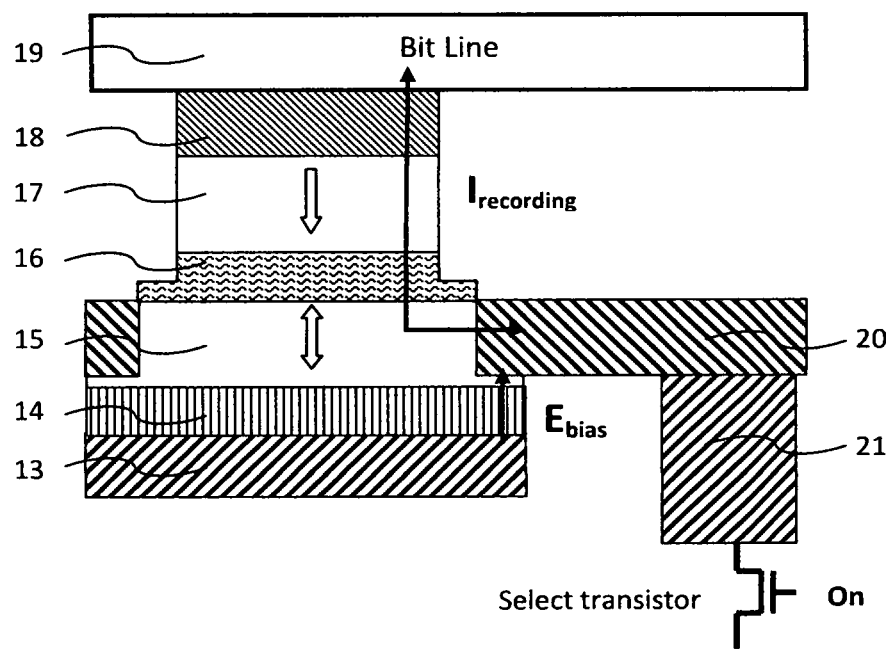
FIG. 2 illustrates a memory element, according to the first embodiment, having an upward electric field on a dielectric functional layer by a positive bias voltage pulse through the digital line and having a spin transfer recording current to reverse the recording layer magnetization to the direction in accordance with a direction of a current along the digital line.
Figure 3:
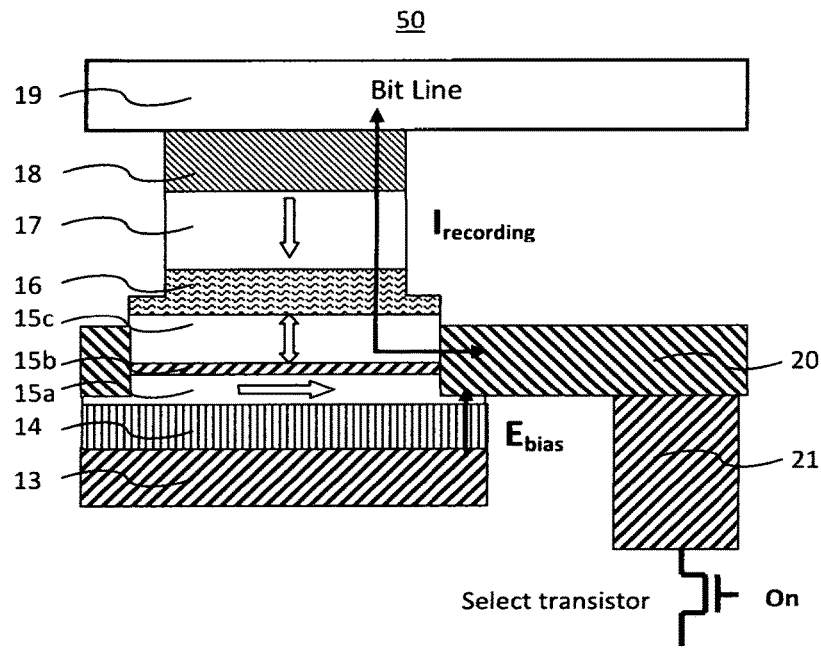
FIG. 3 illustrates a memory element, according to the second embodiment, having an upward electric field on a dielectric functional layer by a positive bias voltage pulse through the digital line to generate a magnetic bias field and having a spin transfer recording current to reverse the recording layer magnetization to the direction in accordance with a direction of a current along the digital line.

FIGS. 2 and 3 show magnetoresistive element 50 illustrating the methods of operating a spin-transfer-torque magnetoresistive memory, according the first and second embodiments, respectively. A circuitry, which is not shown here, is coupled to the bit line for providing a bi-directional recording current between the bit line and the middle electrode connecting to the select transistor, and is coupled to the digital line for providing an electric field on the dielectric functional between the digital line and the middle electrode. The magnetoresistive element 50 comprises: a bit line 19, a cap layer 18, a reference layer 17, a tunnel barrier 16, a recording layer 15, a dielectric functional layer 14, a digital line 13, a middle electrode 20 and a drain contact via 21 of a select transistor.

FIG. 2 illustrates a memory element, according to the first embodiment. The recording layer is made of a single ferromagnetic layer having a perpendicular anisotropy and magnetization, or a multilayer with ferromagnetic sub-layers strongly coupled across thin nonmagnetic insertion sub-layer(s) having a perpendicular anisotropy and magnetization. During a recording operation, a spin transfer current is first tuned on to flow across the MTJ stack, then a positive bias voltage pulse through the digital line is tuned on to generate an electric field pointing upward on a dielectric functional layer. As a result, the perpendicular anisotropy is decreased and the magnetization in the recording layer is readily switched to the direction in accordance with a direction of a spin transfer current across the MTJ stack. As the bias voltage on the digital is tuned off, the magnetization of the recording layer maintains along the recorded perpendicular direction. At last, the spin transfer current is tuned off to finish the recording process.

FIG. 3 illustrates a memory element, according to the second embodiment, having a nonmagnetic insertion sub-layer between two ferromagnetic sub-layers in a recording layer. These two ferromagnetic sub-layers are decoupled due to the relatively thick insertion layer, except that there is only magneto-static interaction between these sub-layers. During a recording operation, a positive bias voltage pulse through the digital line is tuned on to generate an upward electric field on a dielectric functional layer. As a result, the perpendicular anisotropy is decreased to be smaller than a film demag field, and the magnetization in the bottom sub-layer in the recording layer rotates to the film plane to generate an in-plane magnetic bias field acting on the upper sub-layer in the recording layer. Then a spin transfer current is tuned on to flow across the MTJ stack, the spin transfer recording current reverses the recording layer magnetization to the direction in accordance with a direction of a current between the bit line and the select transistor. At last both the bias voltage and the spin transfer current are tuned off to finish the recording process.

The dielectric functional layer 14 serves to modify perpendicular magnetic anisotropy of the recording layer 15. The functional layer 14 is preferred to be made of MgO layer, or other metal oxide (or nitride, chloride) layer which has a rocksalt crystalline as its naturally stable structure thereof will be described later.

The CoFeB (with B content no less than 15%) layer comprised in the recording layer 15 is formed into an amorphous state as deposited. The MgO layer comprised in the functional layer is formed into rocksalt crystal grains with the (100) plane parallel to the substrate plane. In the rocksalt crystal structure, two fcc sublattices for Mg and O, each displaced with respect to the other by half lattice parameter along the [100] direction. Its lattice parameter along the {110} direction is ranged from 2.98 to 3.02 angstrom, which has slightly larger than bcc CoFe lattice parameter along {100} direction and has a lattice mismatch between 4% and 7%. After thermal annealing with a temperature higher than 250-degree, the amorphous CoFeB is crystallized to form bcc CoFe grains having epitaxial growth with (100) plane parallel to surface of the rocksalt crystal layers. Accordingly, a perpendicular magnetization is induced in the recording layer from the interaction at a lower interface with the MgO functional layer.

Since a perpendicular resistance of the MgO layer, generally the dielectric functional layer, increases exponentially with the thickness, a typical areal resistivity aka resistance area product (RA) of an MTJ stack is preferred to be in a range from 3 ohm·μm² to 20 ohm·μm², while a resistance area product (RA) of an dielectric functional layer, i.e., an anisotropy modification layer, is required to be at least 500 ohm·μm² and can be made to be as high as 50K ohm·μm² to 1M ohm·μm², which makes the functional layer a good dielectric layer and the amount of leakage current from a digital line to the MTJ stack is negligible. Applying a positive voltage on the digital line generates an electric field pointing upwards from the top surface of the functional layer and decreases the perpendicular anisotropy strength in a recording layer. Accordingly, the magnetization of the recording layer is readily reversible.

After a successful data recording, a strong perpendicular anisotropy is restored again, maintaining a good thermal stability and data retention of the memory cell. As a result, the margins among reading voltage, recording voltage and break-down voltage are improved.

During fabrication of the MRAM array architecture, each succeeding layer is deposited or otherwise formed in sequence and each magnetoresistive element may be defined by selective deposition, photolithography processing, etching, etc. using any of the techniques known in the semiconductor industry. Typically the layers of the MTJ stack are formed by thin-film deposition techniques such as physical vapor deposition, including magnetron sputtering and ion beam deposition, or thermal evaporation. In addition, the MTJ stack is typically annealed at elevated temperature to achieve a high magnetoresistive ratio and a desired crystal structure and interface.

Referring now to FIGS. 4 through 11, a method of manufacturing a magnetoresistive element 30 in an MRAM array according to the embodiment is described. The magnetoresistive element to be manufactured by the manufacturing method according to this embodiment is the magnetoresistive element 10 of FIG. 1.

Figure 4:
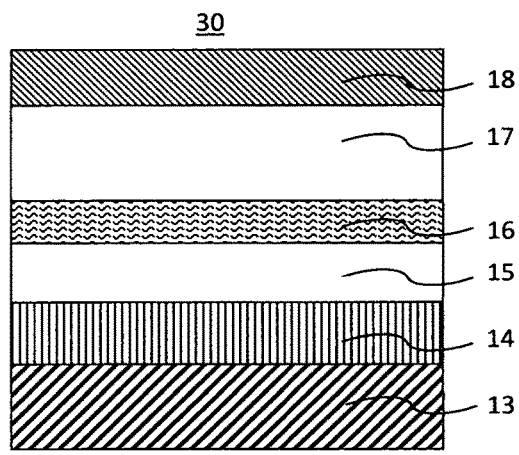
FIG. 4 is a cross-sectional view illustrating a manufacturing method according to the embodiment.

First, as shown in FIG. 4, a magnetoresistive element 30 includes a bottom electrode layer or digital line 13, the dielectric functional layer 14, the recording layer 15, the tunnel barrier layer 16, the reference layer 17, and the cap layer 18 as a hard mask layer, which are sequentially formed on the substrate by sputtering techniques. A patterning is then performed, by using a known lithography technique, down to a bottom surface by anisotropic etching (RIE (Reactive Ion Etching), for example), which is followed by depositing an insulating film made of silicon oxide (SiO₂) or silicon nitride (SiN), for example, on the entire surface, then flattened by chemical mechanical polishing (CMP). The bottom electrode serves as a digital line connecting to a control circuitry which is not shown here.

An example of the material of a recording layer is made of a ferromagnetic material alloy containing at least Boron and Co. A recording layer can also be a multilayer such as M1/X/M2 or M1/X/M2/Y/M3, M(1,2,3) are ferromagnetic sub-layers, and X and Y are insertion sub-layers selected from Ta, Ti, Hf, Nb, V, W, Mo, Zr, Ir, Si, Ru, Al, Cu, Ag, Au, etc., or their oxide, nitride, oxynitride layer, for example. An example of a reference layer is made of TbCoFe(10 nm)/ CoFeB(2 nm). A 2 angstrom thick insertion metal element, such as Ta, Ru or other heavy metal element, is sufficient to achieve an end-point detection during milling processes, thereof will be described later.

Figure 5:
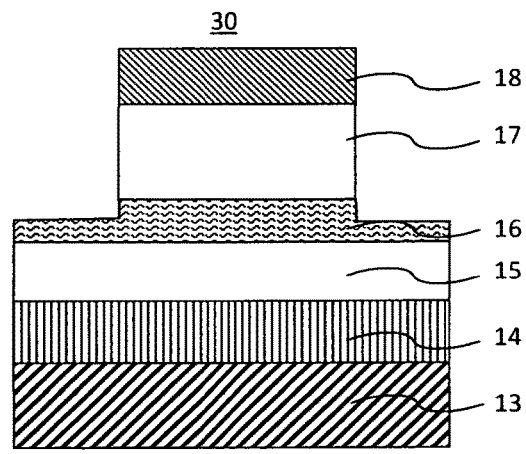
FIG. 5 is a cross-sectional view illustrating a manufacturing method according to the embodiment.

An MTJ stack patterning is then performed by using a known lithography technique or a known etching technique. A mask (not shown) made of a photoresist is formed on the hard mask layer 18. Using the mask, patterning is performed on the hard mask layer 18 and down to middle of tunnel barrier layer 16 by IBE etching and using end-point detection scheme, as shown in FIG. 5.

Since possible re-deposition of metal atoms on the MTJ side wall could be formed, it's preferred to conduct a sputter etching at varied angle to remove these materials from tunnel barrier layer edges. It should be noted that any residual material from the recording layer may be further oxidized to avoid possible current crowding induced MTJ resistance variation. An optional process includes O ion or N ion implantation into the etched surface.

Figure 6:
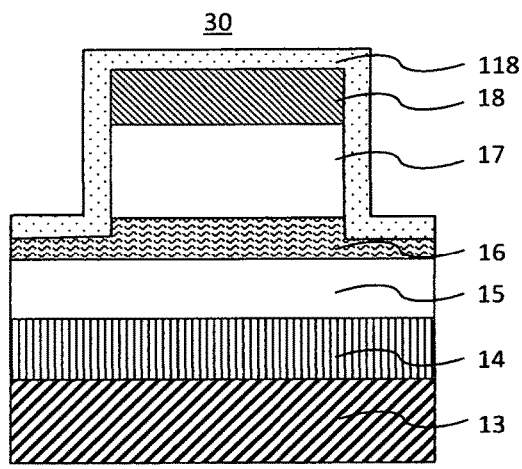
FIG. 6 is a cross-sectional view illustrating a manufacturing method according to the embodiment.

As shown in FIG. 6, a conformal insulating film 118 is then formed by a deposition technique, such as ALD (atomic layer deposition), with a uniform thickness to cover the surface of the patterned film consisting of the tunnel barrier layer 16, the reference layer 17, and the hard mask layer 18.

Figure 7:
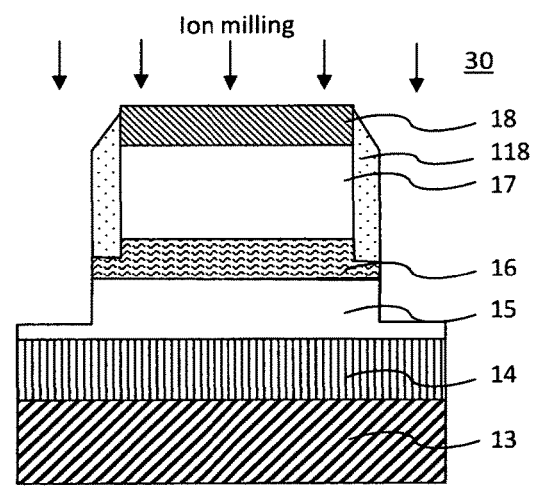
FIG. 7 is a cross-sectional view illustrating a manufacturing method according to the embodiment.

Further an ion milling process having ion beam normal to the substrate surface and having an end-point detection scheme is conducted to etch down to the top surface of the functional layer, as shown in FIG. 7.

Figure 8:
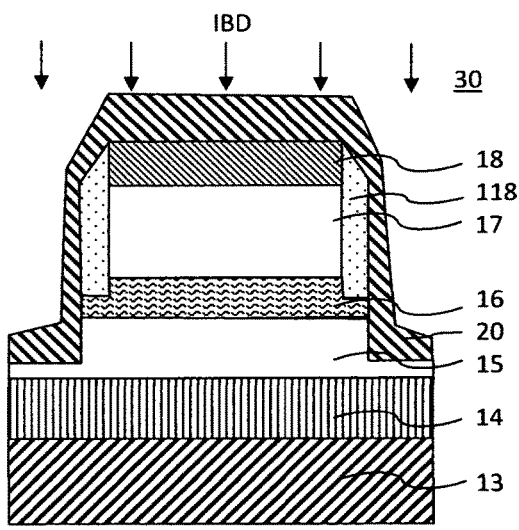
FIG. 8 is a cross-sectional view illustrating a manufacturing method according to the embodiment.
Figure 9:
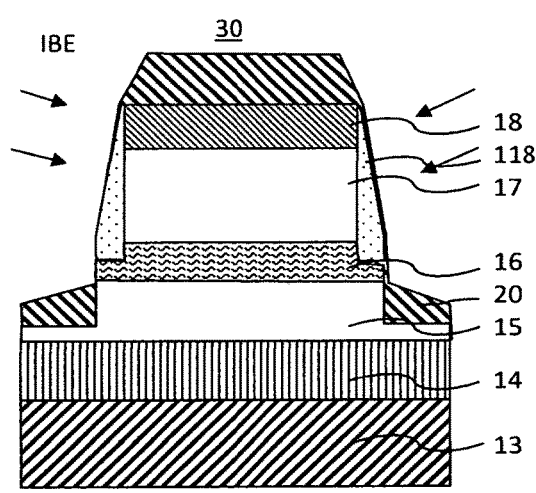
FIG. 9 is a cross-sectional view illustrating a manufacturing method according to the embodiment.

A nonmagnetic metal layer is then deposited by an IBD process having a deposition normal to the substrate surface, as shown in FIG. 8, to form a non-uniform metal covering layer: side wall thickness is much thinner than the thickness at flat region. A rotating IBE process having a large angle is then conducted to mill away the side wall metal layer, as shown in FIG. 9, and leaving a metal layer at flat region as a middle electrode connected to drain contact of a select transistor through a via. A further oxidization to avoid possible current crowding induced MTJ resistance variation can be added as an optional process including O ion or N ion implantation into the etched surface.

Figure 10:
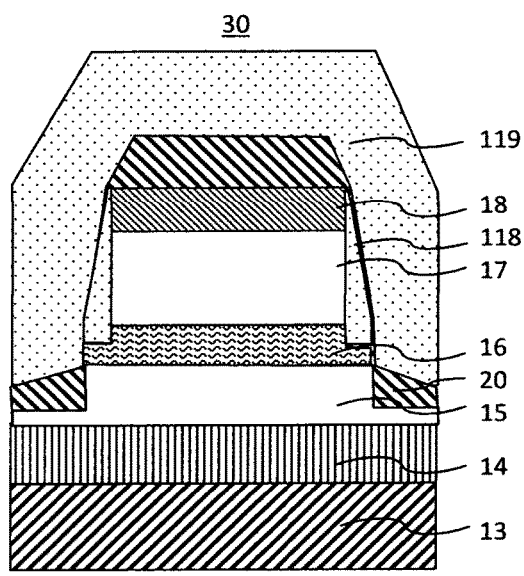
FIG. 10 is a cross-sectional view illustrating a manufacturing method according to the embodiment.
Figure 11:
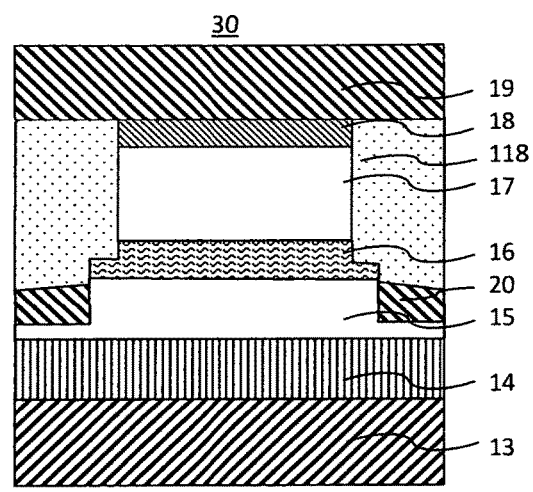
FIG. 11 is a cross-sectional view illustrating a manufacturing method according to the embodiment.

After that, an interlayer insulating film 119 is deposited to cover the entire surface, as shown in FIG. 10. The top surface is then flattened by conducting a CMP process to expose a surface of the top surface of the MTJ film. As shown in FIG. 11, a bit line 19 to be electrically connected to the MTJ stack is formed on the magnetoresistive element 30. The bit line 19 may be made of aluminum (Al) or copper (Cu), for example. Thus, a memory cell of the MRAM of the first embodiment is formed by the manufacturing method according to this embodiment.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A spin-transfer torque magnetoresistive memory comprising a control circuitry and at least one memory cell, wherein the memory cell comprises:
   a substrate layer;
   a digital line layer atop the substrate, serving as a bottom electrode;
   a dielectric functional layer atop the digital line layer;
   a recording layer atop the dielectric functional layer having a magnetic anisotropy in a direction perpendicular to a surface of the recording layer and a variable magnetization direction and having an induced perpendicular anisotropy from an interface interaction with the dielectric functional layer;
   a tunnel barrier layer atop the recording layer;
   a reference layer atop the tunnel barrier having a magnetic anisotropy in a direction perpendicular to a surface of the reference layer and having a invariable magnetization direction;
   a cap layer atop the reference layer, as an upper electric electrode;
   a middle electrode provided on sides of the recording layer and electrically connected to the recording layer;
   a bit line atop the cap layer; and
   a select transistor electrically connected to the middle electrode.

2. The element of claim 1, wherein the dielectric functional comprises one or more of layer(s) from a group of metal oxide, nitride, oxynitride, and chloride having a rock-salt crystal structure having a (100) plane parallel to a surface of the substrate layer and containing at least one element selected from Na, Li, Mg, Ca, Zn, Cd, In, Sn, Cu, and Ag.

3. The element of claim 1, wherein the thickness of the dielectric functional layer is more than 1.5 nm and less than 10 nm.

4. The element of claim 1, wherein the dielectric functional layer has a perpendicular areal resistivity aka resistance area product (RA) of at least 500 ohm·μm².

5. The element of claim 1, wherein the digital line comprises one or more layer(s) of metal comprising at least one element selected from a group of Ru, Cu, Au, Ag, Al, and other highly conductive metal elements, with a total thickness between 2 nm and 2 um.

6. The element of claim 1, wherein the digital line, if it is a multilayer, comprises a surface layer made of one or more element(s) selected from Ta, TaN, AlN, IrN, a nano crystal material, and an amorphous material.

7. The element of claim 1, wherein the recording layer is a ferromagnetic layer comprising CoFeB or CoB, with a Boron (B) composition percentage not less than 10%.

8. The element of claim 1, wherein the recording layer alternatively is a multi-layer comprising ferromagnetic sub-layers and nonmagnetic insertion sub-layers containing at least one element selected from Ta, Hf, Zr, Ti, Mg, Nb, W, Mo, Ru, Al, Cu, and Si and having a thickness less than 0.5 nm.

9. The element of claim 1, wherein the recording layer alternatively is a tri-layer comprising a first ferromagnetic sub-layer containing Boron (B) immediately adjacent to the dielectric functional layer, with a B composition percentage is at least 10%, a second ferromagnetic sub-layer having a perpendicular anisotropy, a nonmagnetic insertion layer provided between the first ferromagnetic sub-layer and the second ferromagnetic sub-layer having a thickness more than 0.3 nm and less than 3 nm.

10. The element of claim 1, wherein the recording layer has a total thickness more than 1.0 nm and less than 10 nm.

11. The element of claim 9, wherein the first ferromagnetic sub-layer has magnetic moment more than 70% of magnetic moments of the second ferromagnetic sub-layer.

12. The element of claim 9, wherein the first ferromagnetic sub-layer has a reduced perpendicular anisotropy smaller than a demag field as an electric field applied on the dielectric functional layer.

13. The element of claim 1, wherein the recording layer is patterned into an in-plane shape having an aspect ratio between 1 to 5.

14. The element of claim 1, wherein the memory cell, alternatively, further comprises an intermediate layer between the digital line and the dielectric functional layer, having an amorphous or nano-crystal structure containing Boron and at least one element from Co, Fe, Ni and having a thickness between 0.3 nm and 3 nm.

15. The element of claim 1, wherein the tunnel barrier layer comprises one or more of material(s) from a group of a metal oxide, a metal nitride, and a metal oxynitride, ideally MgO, ZnO, MgZnO, MgN, and MgON.

16. The element of claim 1, wherein the reference layer is a ferromagnetic layer having a perpendicular anisotropy at least 20% larger than the perpendicular anisotropy of the recording layer.

17. The element of claim 1, wherein the digital line is applied with a voltage, in a recording operation, in a range from 0.5 to 1.8 volt.

18. The element of claim 1, wherein the digital line is applied with a voltage, in a reading operation, in a range between 0 and −1.8 volt.

19. The element of claim 1, wherein the control circuitry is
   coupled through the bit line, the digital line, and the select transistor to selected ones of the plurality of magnetoresistive memory elements;
   configured to provide a bi-directional spin-transfer recording current between the bit line and the select transistor and to provide a positive voltage on the digital line to generate an electric field on the dielectric functional layer and pointing upwards along the thickness direction to reduce the induced perpendicular anisotropy in the recording layer in a recording operation; and
   configured to provide a reading current between the bit line and the select transistor in a reading operation.

* * * * *